United States Patent
Wu

(10) Patent No.: US 7,312,131 B2
(45) Date of Patent: Dec. 25, 2007

(54) METHOD FOR FORMING MULTILAYER ELECTRODE CAPACITOR

(75) Inventor: Hsiao-Che Wu, Chung Li (TW)

(73) Assignee: Promos Technologies Inc., Hsinchu (TW)

( * ) Notice: Subject to any disclaimer, the term of this patent is extended or adjusted under 35 U.S.C. 154(b) by 310 days.

(21) Appl. No.: 10/998,929

(22) Filed: Nov. 30, 2004

(65) Prior Publication Data
US 2006/0115952 A1    Jun. 1, 2006

(51) Int. Cl.
*H01L 21/20* (2006.01)
(52) U.S. Cl. ............... 438/397; 438/254; 257/307; 257/532; 257/E21.648
(58) Field of Classification Search .......... 438/397, 438/254; 257/307, 532, E21.648
See application file for complete search history.

(56) References Cited

U.S. PATENT DOCUMENTS

| | | | | |
|---|---|---|---|---|
| 4,685,197 A | * | 8/1987 | Tigelaar et al. | 438/386 |
| 5,262,662 A | * | 11/1993 | Gonzalez et al. | 257/307 |
| 5,898,982 A | * | 5/1999 | Metzler et al. | 29/25.42 |
| 6,261,895 B1 | | 7/2001 | Adkisson et al. | |
| 6,437,385 B1 | * | 8/2002 | Bertin et al. | 257/301 |
| 2004/0036051 A1 | * | 2/2004 | Sneh | 251/301 |

* cited by examiner

Primary Examiner—B. William Baumeister
Assistant Examiner—Steven J. Fulk

(57) ABSTRACT

A method of forming a multilayer electrode capacitor is described. A trench is formed in a substrate or in an insulator layer. Two sets of conductive layers are deposited on the inner surface of the trench. The first set of conductive layers is electrically connected to each other, and so is the second set of conductive layers. Each of the second set of conductive layers is inserted between two first conductive layers, and dielectric layers are interposed between two conductive layers to form a multilayer electrode capacitor.

24 Claims, 18 Drawing Sheets

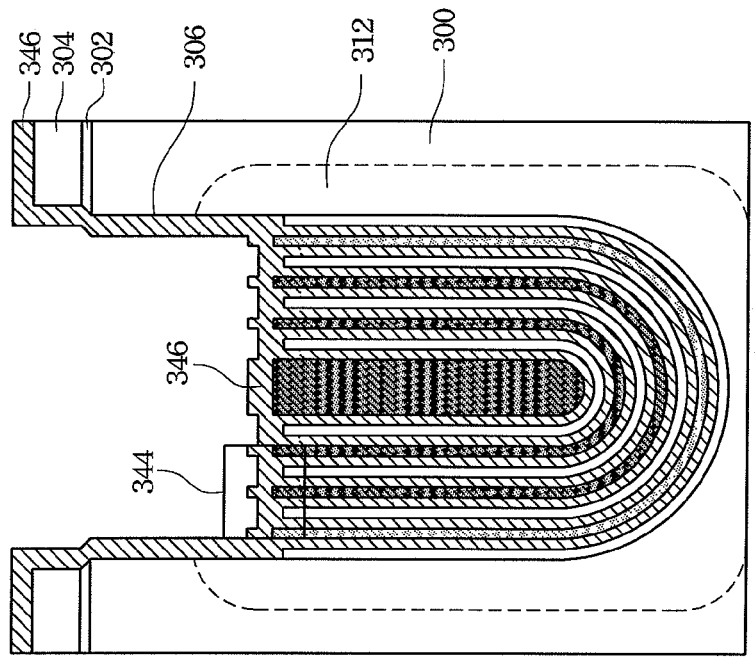
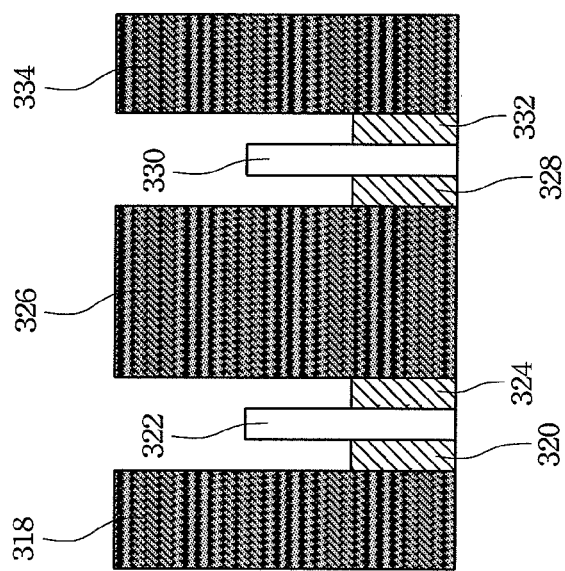
Fig. 3F
Fig. 3E

METHOD FOR FORMING MULTILAYER ELECTRODE CAPACITOR

BACKGROUND

1. Field of Invention

The present invention relates methods for forming capacitors, and particularly to a method for forming a multilayer-electrode capacitor.

2. Description of Related Art

In semiconductor industries, there is a trend to increase the integration and to decrease the scale of semiconductor devices. However, decreasing the scale of a capacitor reduces the storage capacity thereof for electrical charges and leads to low capacitance. Therefore, a method to form capacitors with a high capacitance value and without increasing the size thereof is desired.

Capacitors can be divided into stacked capacitors and trench capacitors according to the production methods thereof. Stacked capacitors are formed on the dielectric layer on a device after finishing all features (such as transistors) and interconnecting lines. The production method for stacked capacitors is simpler and cheaper than that for trench capacitors. But because of the larger area occupied by capacitors on the device, the number of capacitors per unit area is smaller. Depositing several dielectric layers and conductive layers in a trench on a semiconductor substrate forms trench capacitors.

Multilayer electrodes have been developed as a way to achieve capacitors with larger capacitance values without increasing the area occupied by capacitors on the device. U.S. Pat. No. 6,261,895 describes a process for the formation of capacitors having multilayer electrodes for increasing capacitance values. However, conventional methods for forming multilayer electrode capacitors have some drawbacks. For example, FIG. 1A shows a cross-sectional view of a multilayer electrode capacitor. The conventional method for forming the capacitor in FIG. 1A includes following steps: forming a trench in a substrate 102; depositing a first metal layer 104, a first polysilicon layer 106, a first dielectric layer 108, a second polysilicon layer 110, a second metal layer 112, a third polysilicon layer 114, a second dielectric layer 116 and the fourth polysilicon layer 118 on the inner surface of the trench in sequence; depositing a third metal layer 120 on the fourth polysilicon layer 118 to fill the trench; and performing a CMP (chemical-mechanical planarization) process to expose the first metal layer 104. The multilayer structure illustrated in FIG. 1A is thus achieved. FIG. 1B shows a top view of the capacitor in FIG. 1A.

Reference is now made to FIG. 1C. After finishing the structure shown in FIG. 1A, leads 128, 126, 124 and 122 are formed on the exposed surface of the first metal layer 104, the second metal layer 112 and the third metal layer 120 by photolithography. The first metal layer 104 and the third metal layer 120 are connected to an electrode by leads 128, 124 and 122. The second metal layer 126 is connected to the other electrode by leads 126. Then, the first metal layer 104 and the second metal layer 112 can form a capacitor, and the second metal layer 112 and the third metal layer 120 form another capacitor. Therefore, the multilayer-electrode capacitor can increase capacitance value by enlarging the charge storage area in capacitors.

Unfortunately, the conventional multilayer electrode capacitor shown in FIG. 1A has some drawbacks with regard to making leads 128, 126, 124 and 122. Without increasing the area occupied by capacitors on the substrate, each layer formed on the inner surface of the trench has a thickness ranging from several nanometers to no more than a hundred angstroms (Å). Because of the thickness, the leads 122, 124, 126 and 128 cannot be formed on the thin metal layer precisely by the present lithography technology. Improper positioning of the leads causes many electrical defects, such as short circuits, electric leakage or loss of charge-storage capacity.

The prior art also discloses another method for connecting the metal layers in the convention multilayer electrode capacitor. Reference is made to FIG. 1D, in which the conductive layer 130 is used to connect electrically the first metal layer 104, the second metal layer 112 and the third metal layer 120 with the line 132 and overcomes the drawback of the leads made by photolithography. Although the three metal layers 104, 112, 120 are connected as an electrode, the capacitor can not be formed with only one electrode. Therefore, The capacitor shown in FIG. 1D has no function for electrical charge storage.

SUMMARY

It is therefore an aspect of the present invention to provide a method for forming a multilayer electrode capacitor with high capacitance value and without increasing the volume occupied by capacitors on the semiconductor device.

It is another aspect of the present invention to provide a multilayer electrode capacitor with high capacitance value, which capacitor is suitable for stacked or trench capacitors.

In accordance with the foregoing and other aspects of the present invention, a method for forming a multilayer electrode capacitor is provided. A trench is formed in a substrate or in an insulating layer on the substrate. Then, a first conductive layer, a dielectric layer, and a second conductive layer are deposited in the trench in sequence. The foregoing deposition steps of the first conductive layer, the dielectric layer and the second conductive layer can be repeated several times until the trench is filled. As a result, the most inner layer in the trench could be the first conductive layer, the dielectric layer, or the second conductive layer The portions of the first conductive layers, the dielectric layers, and the second conductive layers above the top of the trench are removed. First distances between the top of the first conductive layers and the top of the trench, and second distances between the top of the first conductive layers and the top of the trench are created by a selective wet etching step. The first distances may be greater or smaller than the second distances.

A first insulating layer is formed. The first conductive layers are covered with the first insulating layer and the second conductive layers are exposed when the first distances are greater than the second distances. The second conductive layers are covered with the first insulating layer and the first conductive layers are exposed when the second distances are greater than the first distances.

A first connecting layer is formed to connect electrically with the exposed second conductive layers or the first exposed conductive layers. Portions of the first connecting layer and the first insulating layer are removed to expose portions of the first conductive layers and the second conductive layers. If the first conductive layers are connected with the first connecting layer, a surface treatment is performed to transform the exposed surfaces of the first conductive layer into first insulating surfaces, and to transform the exposed surfaces of the second conductive layers into second conductive surfaces. If the second conductive layers are connected with the first connecting layer, the surface treatment converts the exposed surfaces of the first conductive layers to first conductive surfaces, and converts the exposed surfaces of the second conductive layers to second insulating surfaces.

A second connecting layer is formed to connect the first conductive layer with the first conductive surface, or to connect the second conductive layer with the second conductive surface. The second connecting layer is insulated from the first connecting layer and the first conductive layer with the first insulating surface or the second conductive layer with the second insulating surface.

The surface treatment can be oxidation or nitridation. When the surface treatment is nitridation, the first or the second conductive layer that has a surface converted to a conductive surface is titanium or titanium nitride. When the surface treatment is oxidation, the first or the second conductive layer that has a surface converted to a conductive surface is ruthenium, ruthenium oxide, indium tin oxide (ITO), or indium zinc oxide (IZO). The first or the second conductive layer that has a surface converted to an insulating surface is polysilicon or aluminum. The dielectric layers can be dielectric material with a dielectric constant greater than 3.9, such as silicon nitride, silicon oxide, aluminum oxide, zirconium oxide, titanium oxide, hafnium oxide, strontium oxide, barium titanate, barium oxide, or barium strontium titanate.

The wet etching step makes the first conductive layers and the second conductive layers different in height according the etching rates thereof. Therefore, the first connecting layer only connects with the first conductive or only connect with the second conductive layers. The surface treatment converts the surfaces of the conductive layers which do not connect with the first connecting layer to conductive surfaces, so that the conductive layers with the conductive surfaces electrically connect with the second connecting layer, but are electrically insulated from the first connecting layer. In this manner, one of electrodes with multilayer in a capacitor are obtained. Further, there is no need for the wet etching step and the surface treatment to be, performed in a specific order. For example, the surface treatment can be performed to let the first connecting layer electrically connect with one kind of the conductive layers, such as the first conductive layers. Then the wet etching step is performed latterly to let the other kind of the conductive layers become higher than the conductive layers that connect with the first connecting layer for connecting with the second connecting layer. Alternatively, both kinds of conductive layers can connect with the first and the second connecting layers, respectively, by the wet etching step.

The present invention advantageously forms a multilayer electrode structure in a capacitor to increase the capacitance value without increasing the area occupied by the capacitor.

Another advantage of the present invention is that the present invention is suitable for producing trench capacitors or stacked capacitors.

BRIEF DESCRIPTION OF THE DRAWINGS

The other objects and features of the present invention can be more fully understood by referring to the following description of preferred embodiments and accompanying drawings, in which:

FIG. 3E is a close view of portion 344 in FIG. 3D;

FIG. 3F is a schematic, cross-sectional view of the substrate, illustrating an insulating layer deposited on the top surfaces of the conductive layers and the sidewall of the trench;

DESCRIPTION OF THE PREFERRED EMBODIMENTS

Figure 1A:
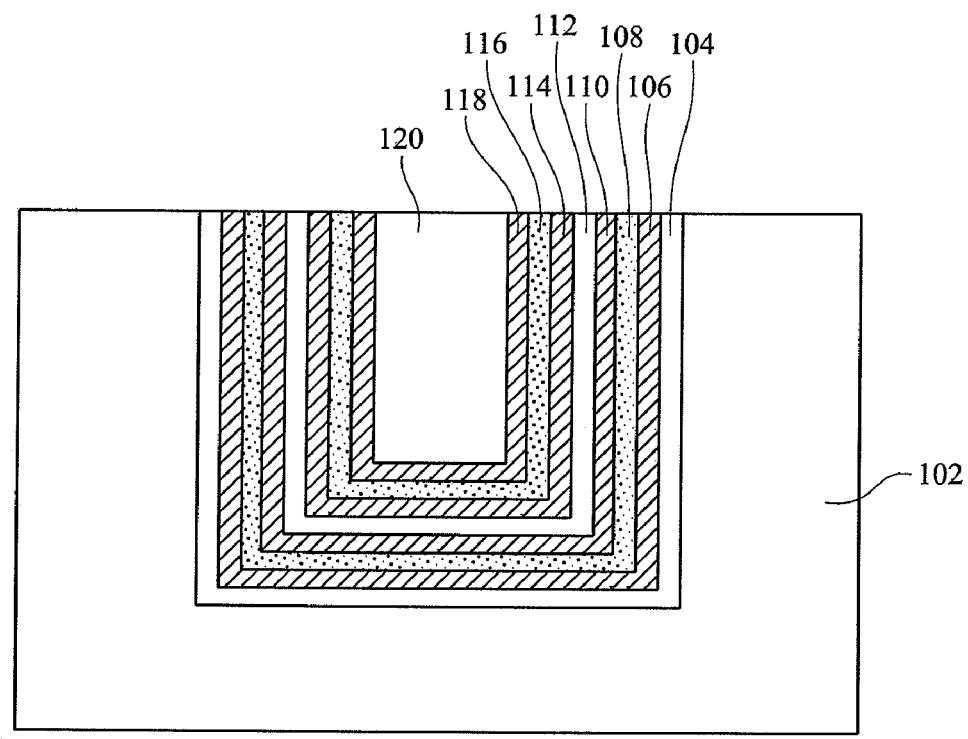
FIG. 1A is a schematic, cross-sectional view of a conventional multilayer electrode capacitor for illustrating the multilayer structure thereof.
Figure 1B:
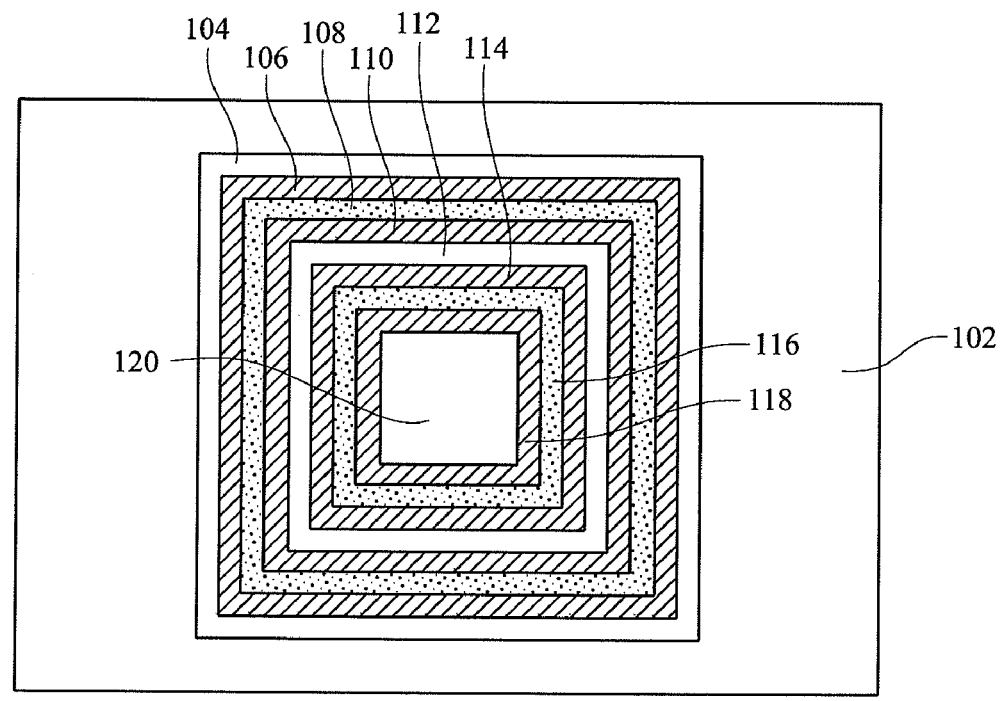
FIG. 1B is a schematic, cross-sectional view of a conventional multilayer-electrode capacitor.
Figure 1C:
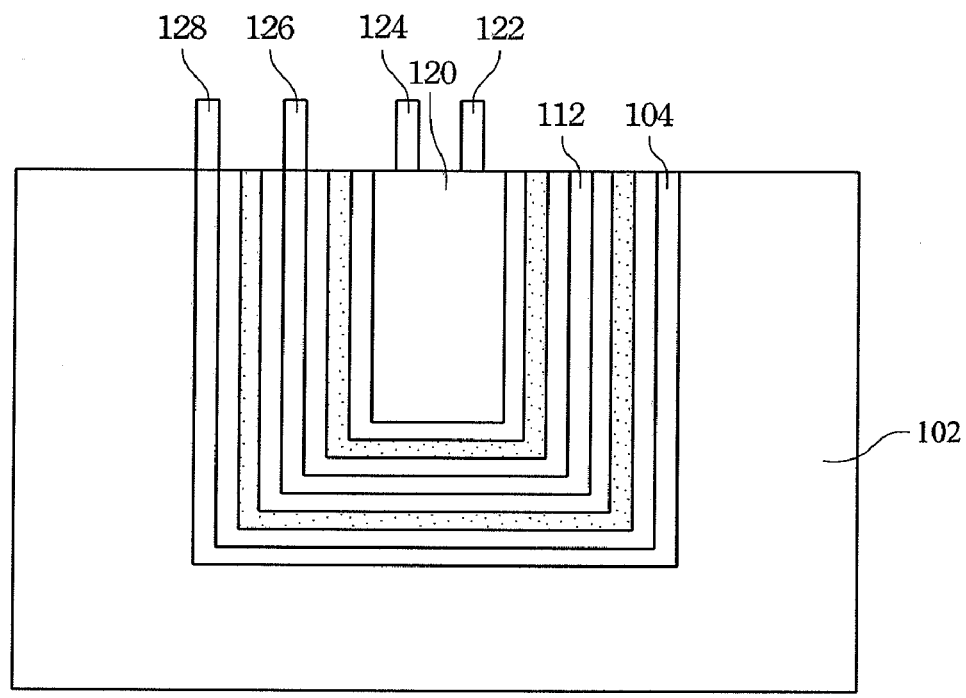
FIG. 1C is a schematic, cross-sectional view of a conventional multilayer electrode capacitor for illustrating the connection of conductive layers by contact tabs.
Figure 1D:
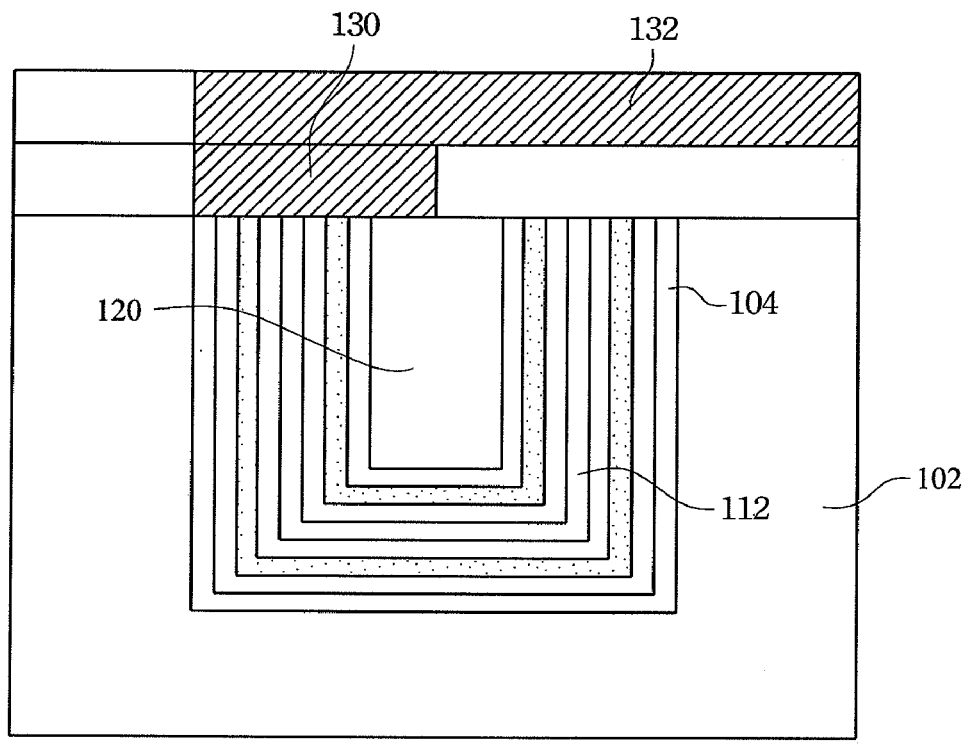
FIG. 1D is a schematic, top view of a conventional multilayer electrode capacitor for illustrating the connection of conductive layers by a metal layer.
Figure 2A:
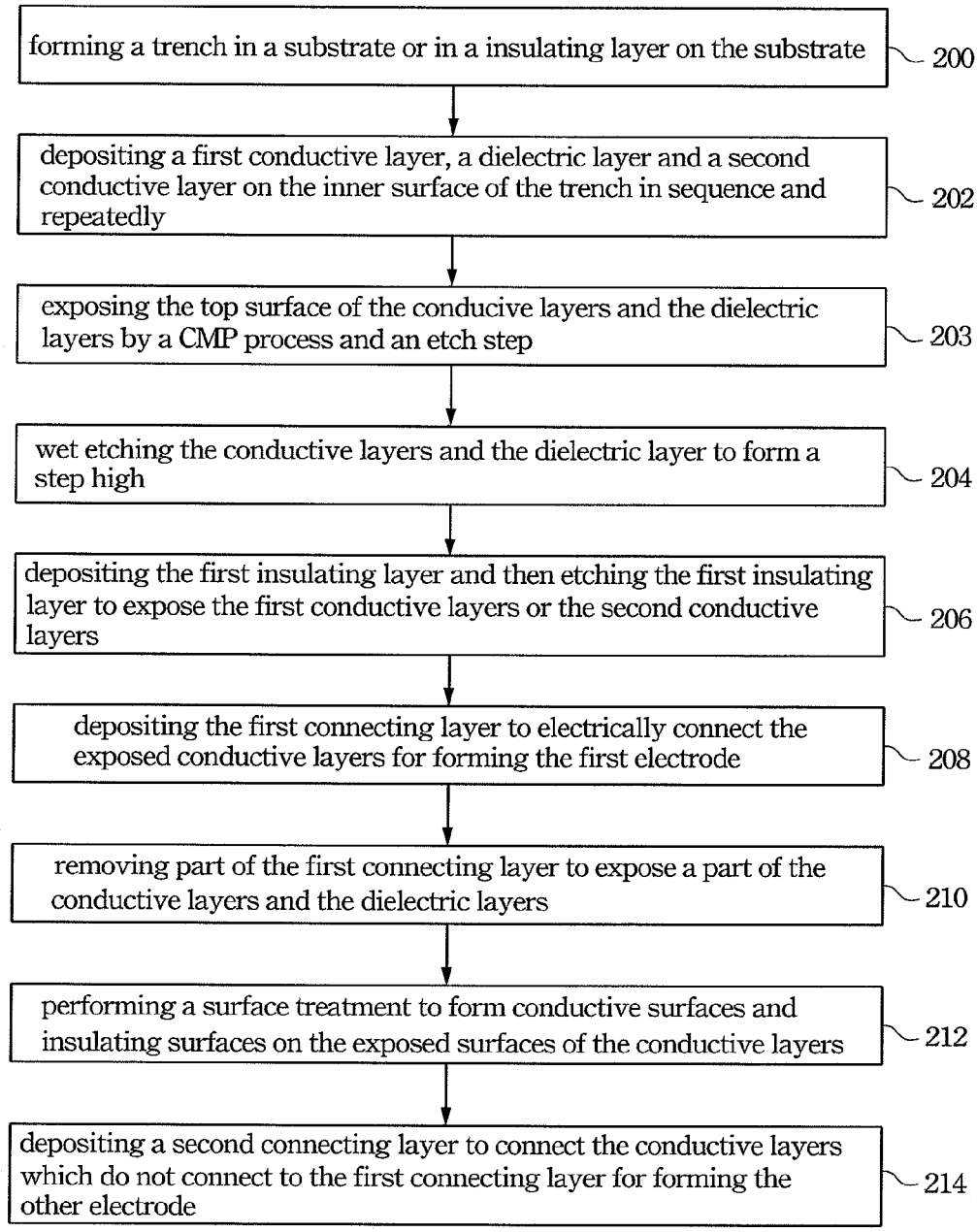
FIG. 2A is a flow chart of a method for forming a multilayer electrode capacitor according to one embodiment of the present invention.

According to the present invention, methods for forming a multilayer electrode capacitor are disclosed. Referring to FIG. 2A, FIG. 2A is a flow chart showing a method for forming a multilayer electrode capacitor according to the present invention. A trench is formed in a semiconductor substrate or in the dielectric layer on the transistor of a semiconductor device by performing an etching step 200. A depositing step 202 is preformed repeatedly to deposit a first conductive layer and a second conductive layer in sequence until the trench is filled. A dielectric layer is formed between the first conductive layer and the second conductive layer. After performing a CMP and etching step 203, the respective top surfaces of the conductive layer and the dielectric layer are exposed, and a recess depth from the top of the layers to the top of the trench is formed.

The first conductive layer, the second conductive layer, and the dielectric layer are different in height by performing a wet-etching step 204. The wet-etching step has different etching selectivity for the first conductive layer, the second conductive layer and the dielectric layer. Thus, a first distance between the top of the first conductive layer and the top of the trench, and a second distance between the top of the second conductive layer and the top of the trench are created. The first distance may be greater or smaller than the second distance. The distance between the top of the dielectric layer and the top of the trench is greater than both the first and the second distances.

For example, when the first conductive layer, the second conductive layer and the dielectric layer are made of titanium nitride, polysilicon and silicon nitride respectively, a 5:1 buffered hydrofluoric acid (BHF) may be used to perform a wet-etching step at 20° C. The etch rates of titanium nitride, polysilicon and silicon nitride in the 5:1 buffered hydrofluoric acid are 25 Å/min, 9 Å/min and 82 Å/min, respectively. Then the first distance is greater than the second distance. A mixture containing 80% phosphate, 5% nitric acid, 5% acetic acid and 10% water may be used to perform a wet-etching step at 50° C. when the first and the second conductive layers are titanium and polysilicon, respectively. The etching rates of titanium and polysilicon are 0 Å/min and 10 Å/min. After wet etching, the first distance between the top of the first conductive layer and the top of the trench, and the second distance between the top of the second conductive layer and the top of the trench are created, and the first distance is smaller than the second distance. Alternatively, using a solution containing 9% Ceric Ammonium Nitrate $((NH_4)_2Ce(NO_3)_6)$, 6% perchloric acid $(HClO_4)$ and water to perform the wet-etching step at 20° C., the etching rates of titanium and polysilicon are 20 Å/min and 0 Å/min. So the first distance between the top of the first conductive layer and the top of the trench, and the second distance between the top of the second conductive layer and the top of the trench are created, and the first distance is greater than the second distance.

After wet etching to make each layer different in height, a first insulating layer is deposited on the substrate, the sidewall of the trench, the first and the second conductive layers, and the dielectric layer, and then the first insulating layer is etched in step 206. After etching the first insulating layer, the first insulating layer covers the first conductive layer and the second conductive layer is exposed when the first distance is greater then the second distance. When the first distance is smaller than the second distance, the first insulating layer covers the second conductive layer and the first conductive layer is exposed.

In step 208, a first connecting layer is deposited on the exposed surfaces of the conductive layers and the dielectric layers in the trench. The first connecting layer connects with the second conductive layers to form an electrode of the capacitor when the first conductive layers are covered by the first insulating layer and the second conductive layers are exposed. The first connecting layer connects with the first conductive layers to form an electrode of the capacitor when the second conductive layers are covered by the first insulating layer and the first conductive layers are exposed. In step 210, the first connecting layer is equally divided into two parts vertically, and one of the parts is removed to expose portions of the first and the second conductive layers and the dielectric layers.

After step 210, a surface treatment 212 is performed. The surface treatment 212 is oxidation or nitridation to convert the exposed surfaces of the first and the second conductive layers to conductive surfaces or insulating surfaces. When the first connecting layer connects with the second conductive layers to form one of the electrodes in the step 208, the first conductive layers are made of the materials that will have a conductive surface after surface treatment 208, and the second conductive layers are made of the materials that will have a insulating surface after surface treatment 208. When the first connecting layer connects with the first conductive layers to form one of the electrodes in the step 208, the first conductive layers are made of the materials that will have an insulating surface after surface treatment 208, and the second conductive layers are made of the materials that will have a conductive surface after surface treatment 208.

In step 214, a second connecting layer is deposited on the substrate, and covers the dielectric layers and the conductive layers with the conductive surface or with the insulating surface. The second connecting layer electrically connects with the first conductive layers or the second conductive layers with the conductive surfaces to form the other electrode in the capacitor. Then, the multilayer electrode capacitor is obtained according to the present invention.

Figure 2B:
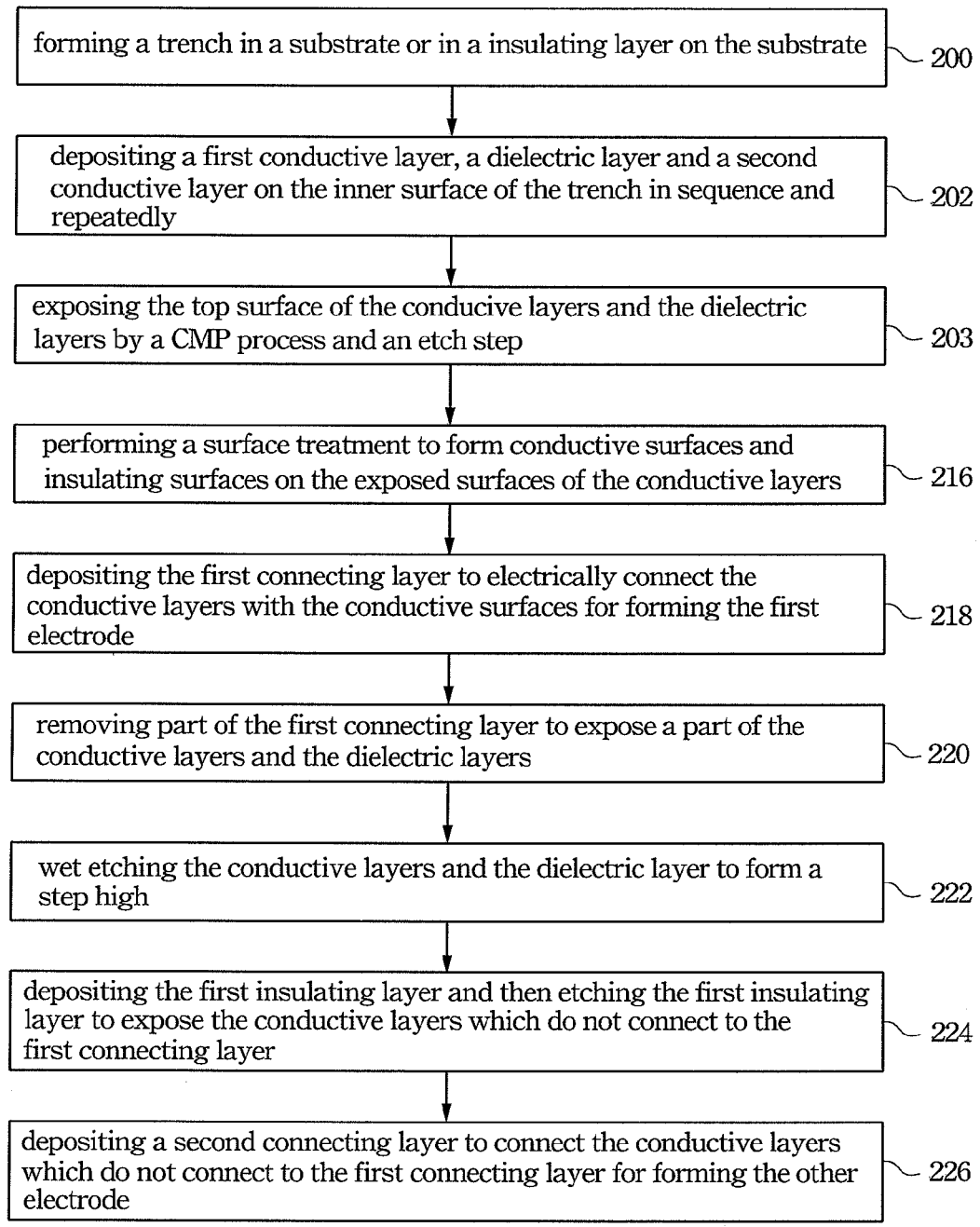
FIG. 2B is a flow chart of a method for forming a multilayer electrode capacitor according to another embodiment of the present invention.

The method shown in FIG. 2A can be modified according to the present invention. FIG. 2B is a flow chart showing a modified method according to the method shown in FIG. 2A. In FIG. 2B, steps 200, 202 and 203 are like the steps in FIG. 2A. Then, a surface treatment step 216 follows the step 203. In the surface treatment step 216, conductive surfaces or insulating surfaces are formed on the exposed surface of the conductive layers by surface treatment. If the first conductive layers are made of materials which become insulated after surface treatment, the second conductive layers should be made of materials that remain conductive after surface treatment. If the second conductive layers are made of materials that become insulated after surface treatment, the first conductive layers should be made of materials that remain conductive after surface treatment.

In step 218, a first connecting layer is formed on the dielectric layers and the conductive layers with the conductive surfaces or with the insulating surfaces. The first connecting layer electrically connects with the first conductive layers with the conductive surfaces, or connects with the second conductive layers with the conductive surfaces to form one of the electrodes in the capacitor. Then, after performing step 220, the first connecting is equally defined into two parts vertically and one of the two parts is removed by photolithography and etching. After removing the insulating surfaces and the conductive surfaces by etching, the first conductive layers, the second conductive layers and the dielectric layers are exposed.

In the wet etching step 222, the exposed first conductive layers, the second conductive layers and the dielectric layers are etched and become different in height. In this manner, first distances between the top of the first conductive layers and the top of the trench are created. Second distances between the top of the second conductive layers and the top of the trench are created, too. Further, the distances between the top of the dielectric layers and the top of the trench are greater than both the first and the second distances. If the first connecting layer electrically connects with the first conductive layers in step 218, the first distances should be greater than the second distances in the wet etching step 222. Alternatively, if the first connecting layer electrically connects with the second conductive layers in step 218, the second distances should be greater than the first distances in the wet etching step 222.

In step 224, a first insulating layer is formed on the substrate, the sidewall of the trench, the first conductive layers, the second conductive layers and the dielectric layers. Then, the first insulating layer is etched to expose the first or the second conductive layers. When the first distances are greater than the second distances, the first insulating layer covers the first conductive layers and the second conductive layers are exposed after etching. When the first distances are smaller than the second distances, the first insulating layer covers the second conductive layers and the first conductive layers are exposed after etching.

In depositing step 226, a second connecting layer is deposited on the substrate. When the first insulating layer covers the first conductive layers and the second conductive layers are exposed in the step 224, the second connecting layer electrically connects with the second conductive layers to form the other electrode in the capacitor. When the first insulating layer covers the second conductive layers and the first conductive layers are exposed in the step 224, the second connecting layer electrically connects with the first conductive layers to form of the other electrode in the capacitor. The multilayer-electrode capacitor is obtained according to the present invention.

Figure 2C:
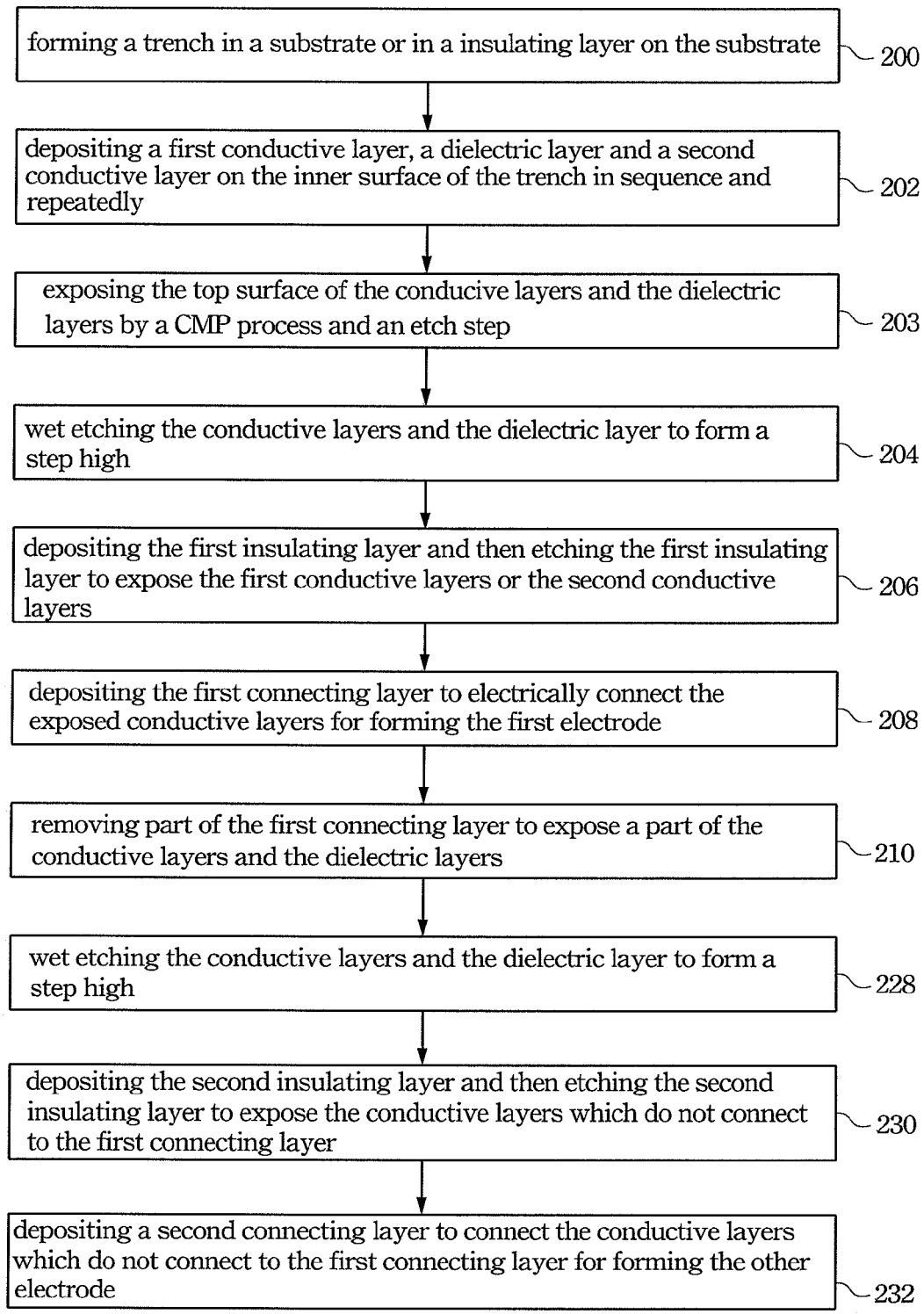
FIG. 2C is a flow chart of a method for forming a multilayer-electrode capacitor according to still another embodiment of the present invention.

The method of the present invention for forming a multilayer-electrodecapacitor can be modified according to the methods shown in FIG. 2A and in FIG. 2B. FIG. 2C is a flow chart showing yet another method for forming a multilayer-electrodecapacitor according to the present invention. In FIG. 2C, steps 200-210 are like the steps shown in FIG. 2A. After step 210, a wet etching step 228 is selected. In the wet etching step 228, third distances between the top of the first conductive layers and the top of the trench, and fourth distances between the top of the second conductive layers and the top of the trench are created. The third distances may be greater or smaller than the fourth distances. Further, distances between the top of the dielectric layers and the top of the trench are greater than both the third and the fourth distances. It should be noted that, if the first connecting layer electrically connects with the first conductive layers in the step 208, the fourth distances should be smaller than the third distances after the wet etching step 228. Alternatively, if the first connecting layer electrically connects with the second conductive layers in the step 208, the fourth distances should be greater than the third distances after the wet etching step 228.

In step 230, a second insulating layer is deposited to cover the substrate, the sidewall of the trench, the first and the second conductive layers, the dielectric layers, and the first connecting layer. Then, the second insulating layer is etched to expose the first or the second conductive layers. When the third distances are greater than the fourth distances, the second insulating layer covers the first conductive layers, and the second conductive layers are exposed. When the third distances are smaller than the fourth distances, the second insulating layer covers the second conductive layers, and the first conductive layers are exposed.

In depositing step 232, a second connecting layer is formed on the substrate. When the second insulating layer covers the first conductive layers and exposes the second conductive layers, the second connecting layer electrically connects with the second conductive layers. If the second insulating layer covers the second conductive layers and exposes the first conductive layers, the second connecting layer electrically connects with the first conductive layers to form of the other electrodes in the capacitor. The multilayer-electrode capacitor is obtained according to the present invention.

If the first conductive layers are made of the materials that become insulated after surface treatment, the second conductive layers should be made of materials that retain conductivity after surface treatment shown in FIG. 2A and FIG. 2B. If the second conductive layers are made of the materials that become insulated after surface treatment, the first conductive layers should be made of materials that retain conductivity after surface treatment. Materials that retain conductivity after nitridation are titanium or titanium nitride. Materials that retain conductivity after oxidation are ruthenium, ruthenium oxide, indium tin oxide (ITO), or indium zinc oxide (IZO). Materials that become insulated after nitridation or oxidation are polysilicon or aluminum. The dielectric layers can be dielectric material with a dielectric constant greater than 3.9, such as silicon nitride, silicon oxide, aluminum oxide, zirconium oxide, titanium oxide, hafnium oxide, strontium oxide, barium titanate, barium oxide, or barium strontium titanate. The number of the conductive layers and the dielectric layers can be changed according to need.

For more fully understanding the spirit of the present invention, several preferred embodiments are described as follows to show the application and methods for forming a multilayer electrode capacitor according the present invention.

The First Preferred Embodiment

Figure 3A:
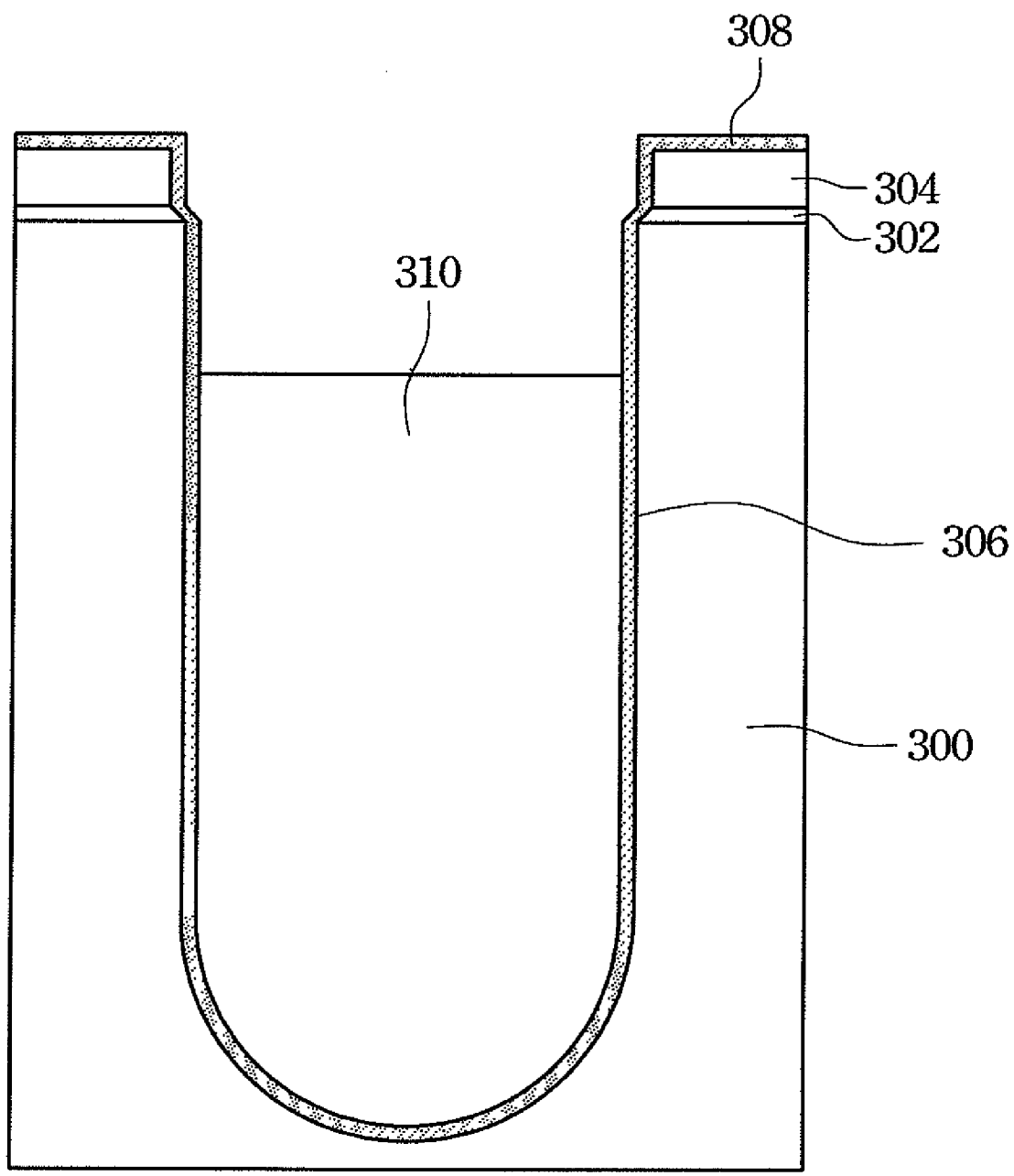
FIG. 3A is a schematic, cross-sectional view of a semiconductor substrate having a trench therein.

In first preferred embodiment, a trench multilayer electrode capacitor is produced in a semiconductor substrate according the present invention. In FIG. 3A, a pad oxide 302 and a hard mask 304 are formed on the substrate for protection or being a stop layer in an etching or CMP process. Then, a trench 306 is formed in the substrate 300 by photolithography and etching technology. A doped oxide 308 is deposited on the substrate 300 and the inner surface of the trench 306 for ion drive-in. After depositing and recessing a photoresist 310 in the trench 306, the structure shown in FIG. 3A is achieved.

Figure 3C:
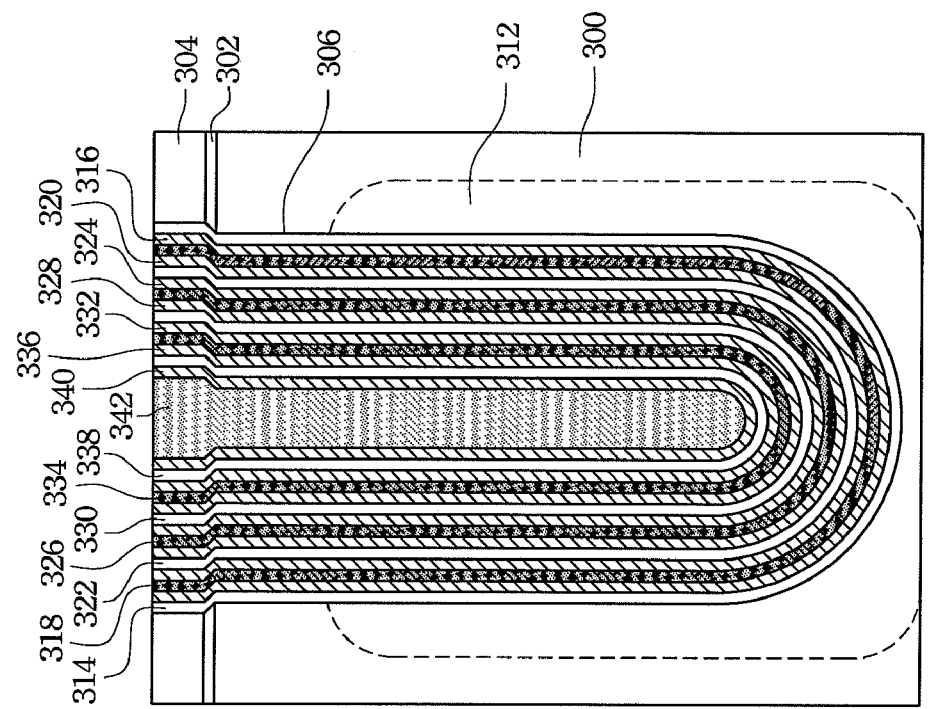
FIG. 3C is a schematic, cross-sectional view of the substrate, illustrating the multilayer structure of conductive layers and dielectric layers in the trench.
Figure 3B:
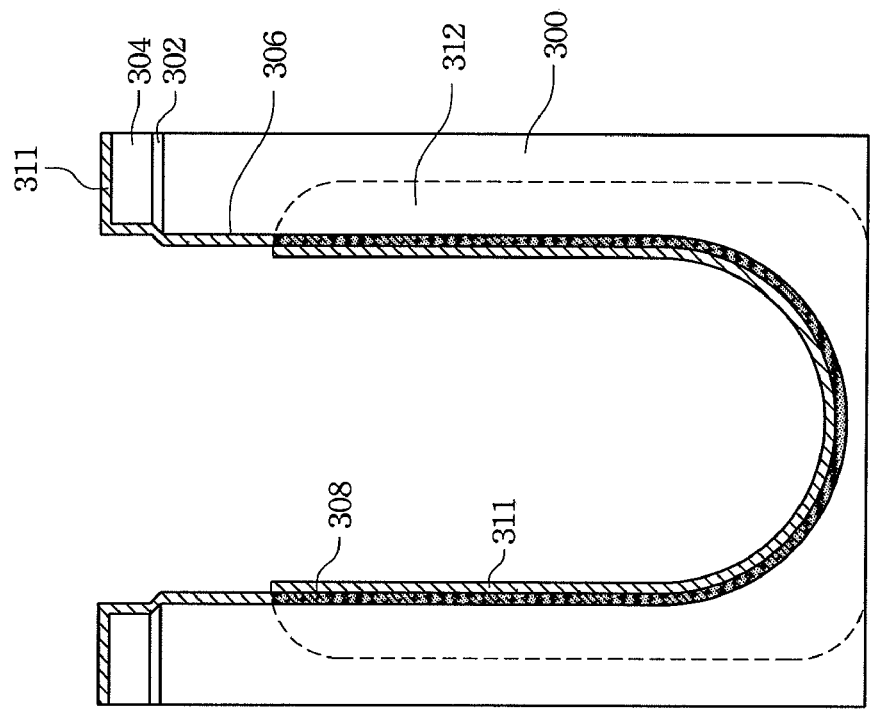
FIG. 3B is a schematic, cross-sectional view of the substrate, illustrating a doping area surrounding the trench.

A portion of the doped oxide 308, which is not masked by the photoresist 310, is removed by wet etching. The photoresist 310 is removed by any conventional process. Subsequently, an oxide 311 is formed on the substrate 300, the exposed area of the trench 306, and the doped oxide 308. The oxide 311 prevents the dopant from diffusing to areas not covered by the doped oxide 308. In FIG. 3B, a doped area 312 is obtained after a drive-in process. The doped area 312 is used to connect with a part of the conductive layers electrically.

After removing the oxide 311 and the doped oxide 308 by a wet etching process, a first conductive layer 314, a first dielectric layer 316, a second conductive layer 318, a second dielectric layer 320, a third conductive layer 322, a third dielectric layer 324, a fourth conductive layer 326, a fourth dielectric layer 328, a fifth conductive layer 330, a fifth dielectric layer 332, a sixth conductive layer 334, a sixth dielectric layer 336, a seventh conductive layer 338 and a seventh dielectric layer 340 are deposited on the inner surface of the trench 306 in sequence. Finally, an eighth conductive layer 342 is deposited in the trench until the trench 306 is filled. A CMP process or an etching step is performed to expose the top surfaces of the conductive layers and the dielectric layers. All the conductive layers and the dielectric layers are coplanar with the hard mask 304. The structure of the trench is shown in FIG. 3C.

The first, the third, the fifth and the seventh conductive layers 314, 322, 330, 338 are titanium nitride. The second, the fourth, the sixth and the eighth conductive layers 318, 326, 334, 342 are polysilicon. The dielectric layers 316~340, are any material with a high dielectric constant, such as silicon nitride.

Figure 3D:
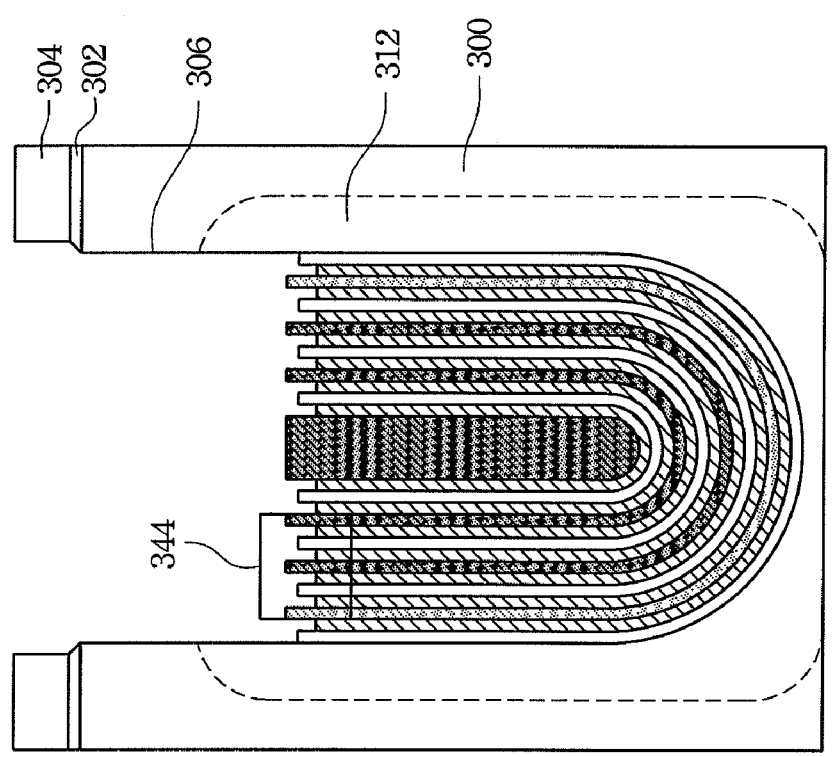
FIG. 3D is a schematic, cross-sectional view of the substrate, illustrating the difference in height of the conductive layers and the dielectric layers.

A portion of each layer in the trench 306 are removed by a dry etching process. Then, the conductive layers and the dielectric layers are etched by a wet etching step, using, for example, a buffered hydrofluoric acid. In this manner, the conductive layers and the dielectric layers are different in height, and a structure illustrated in FIG. 3D is achieved. FIG. 3E shows the close view of portion 344 in FIG. 3D. In FIG. 3D, the second, the fourth, the sixth and the eight conductive layers 318, 326, 334, 342 made of polysilicon are highest because of the lowest etching rate in wet etching step. The first, the third, the fifth and the seventh conductive layers 314, 322, 330, 338 made of titanium nitride are lower, and the dielectric layers are the lowest because of the most fast etching rate in the wet etching step.

Figure 3H:
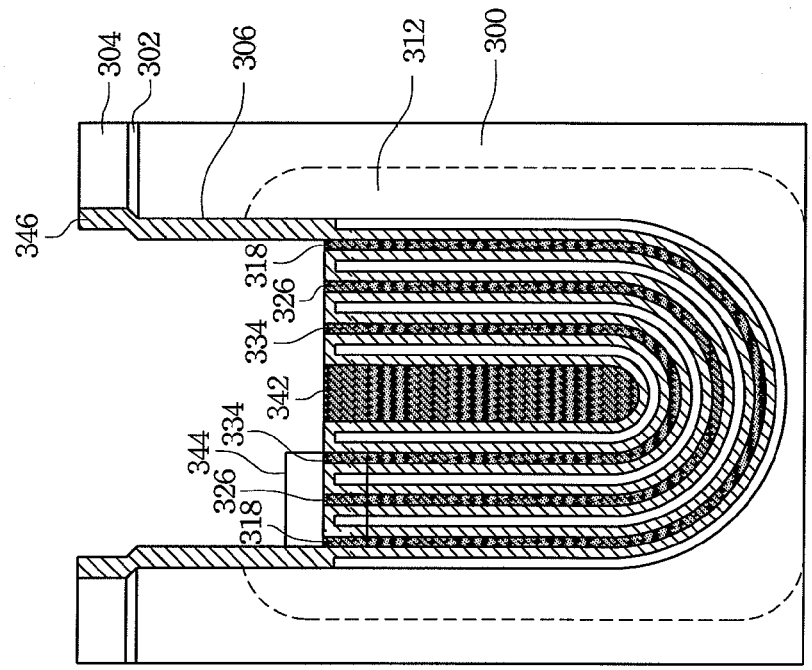
FIG. 3H is a schematic, cross-sectional view of the substrate, illustrating the structure of the unfinished multilayer electrode capacitor.
Figure 3G:
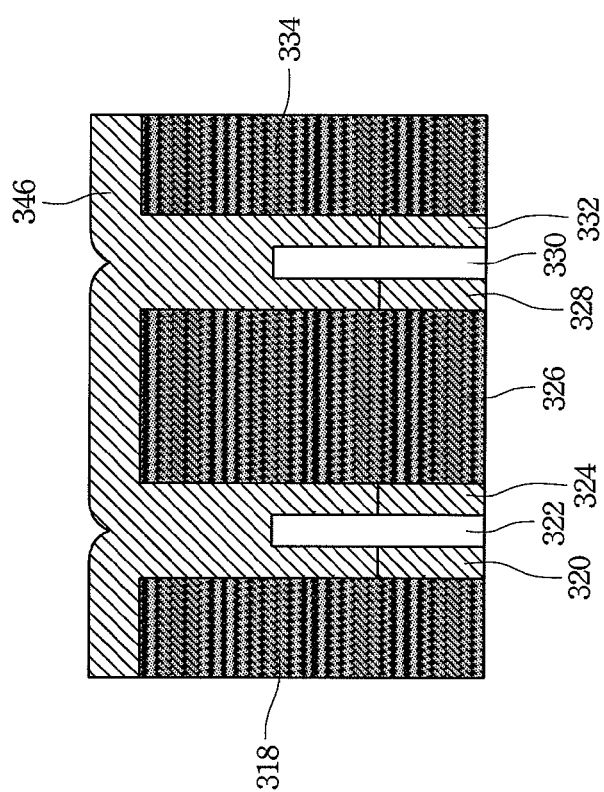
FIG. 3G is a close view of portion 344 in FIG. 3F.
Figure 3J:
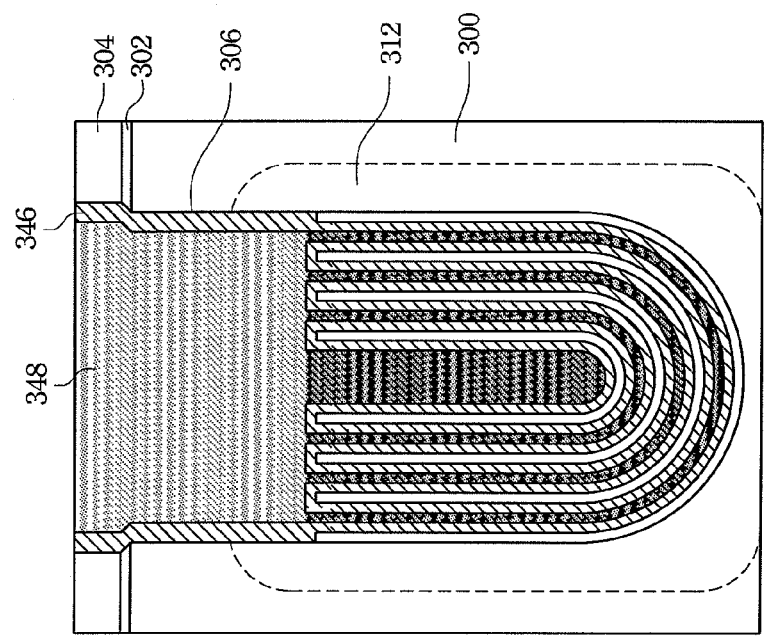
FIG. 3J is a schematic, cross-sectional view of the substrate, illustrating the structure of the unfinished multilayer electrode capacitor.
Figure 3I:
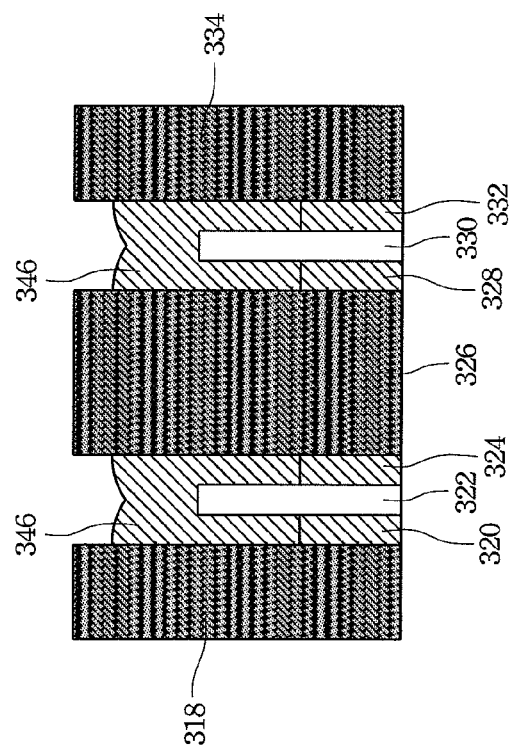
FIG. 3I is a close view of portion 344 in FIG. 3H.

Referring to FIG. 3F, a first insulating layer 346 is deposited on the inner surface of the trench 306 and the exposed surfaces of the conductive layers and the dielectric layers. The first insulating layer also fills the gaps between the conductive layers and the dielectric layers. FIG. 3G shows a close view of portion 344 in FIG. 3F. In FIG. 3H, a portion of the first insulating layer is removed to expose the second, the fourth, the sixth and the eighth conductive layers 318, 326, 334, 342. FIG. 3I shows the close view of portion 344 in FIG. 3H. FIG. 3I illustrates that the top surface of the second, the fourth, the sixth and the eighth conductive layers 318, 326, 334, 342 are exposed, and the top surface of the first, the third, the fifth and the seventh conductive layers 314, 322, 330, 338 and the sidewall of the trench 306 are still covered by the first insulating layer.

A first connecting layer 348 is deposited to fill the trench 306. A CMP process is performed to remove the first connecting layer until reaching the hard mask 304, and a structure as shown in FIG. 3J is obtained. In FIG. 3J, the first connecting layer connected with the second, the fourth, the sixth and the eighth conductive layers 318, 326, 334, 342 forms one of electrodes in the capacitor of the first embodiment.

Figure 3K:
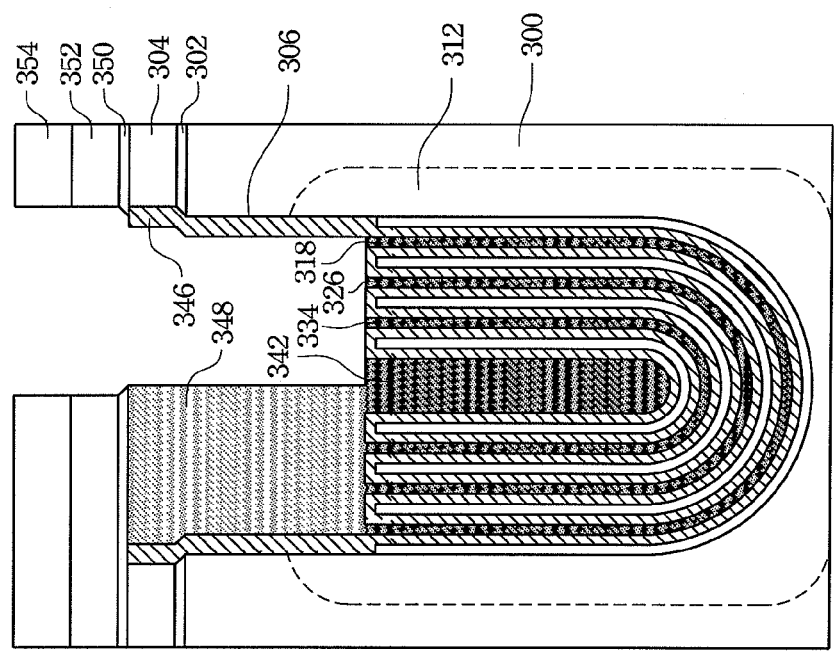
FIG. 3K is a schematic, cross-sectional view of the substrate, illustrating the structure of the unfinished multilayer electrode capacitor.

A pad oxide 350, a nitride layer 352 and a mask 354 are deposited on the substrate 300 and the first connecting layer 348. The first connecting layer is equally defined into two parts vertically, and one of the parts is removed to expose the second, the fourth, the sixth and the eighth conductive layers by conventional photolithography and etching. Then, a structure as shown in FIG. 3K is obtained.

Figure 3M:
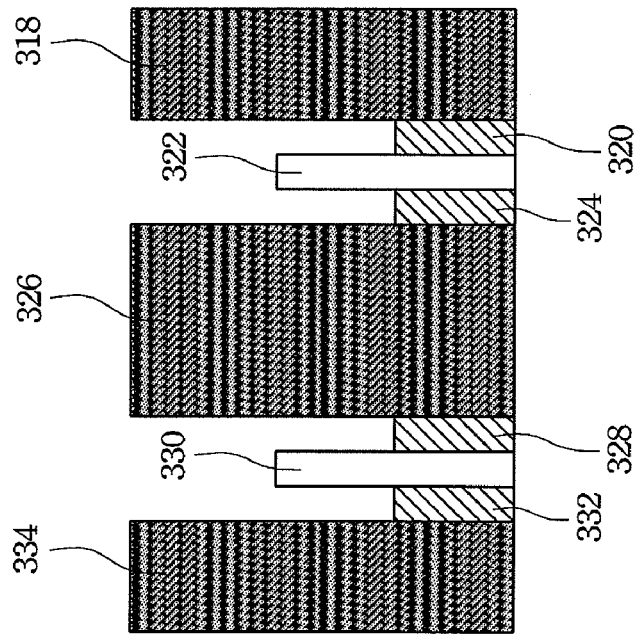
FIG. 3M is a close view of portion 355 in FIG. 3L.
Figure 3L:
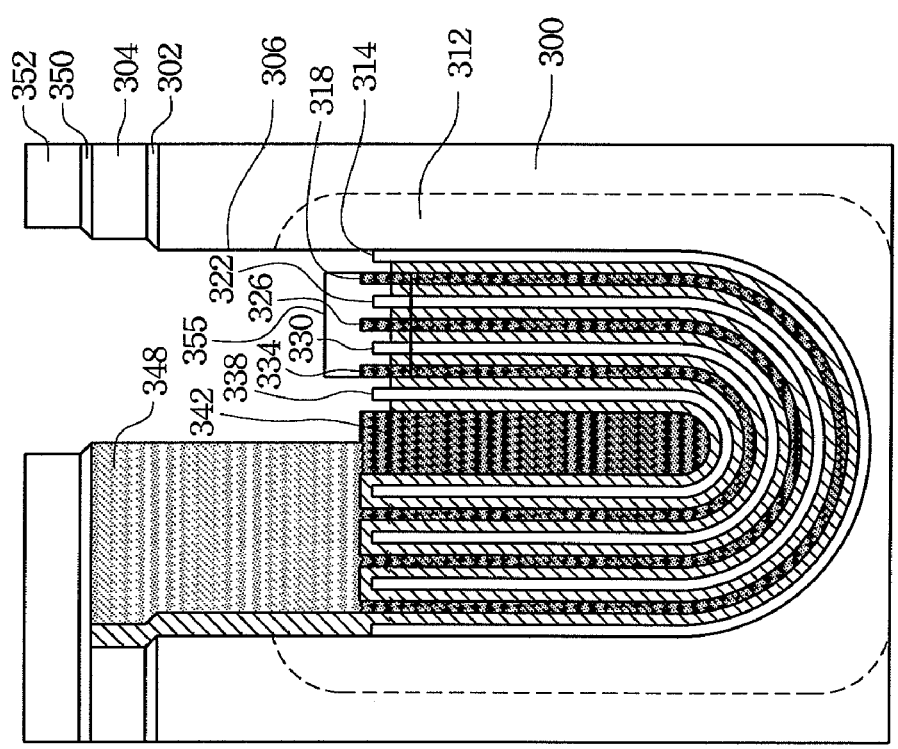
FIG. 3L is a schematic, cross-sectional view of the substrate, illustrating the structure of the unfinished multilayer electrode capacitor.

The mask 354 and a portion of the nitride layer 352 are removed by dry etching or wet etching. Further, a portion of the first insulating layer 346, which is not covered by the first connecting layer 348, is removed by a wet etching process using, for example, phosphoric acid. In this manner, the top surfaces of first, the third, the fifth and the seventh conductive layers 314, 322, 330, 338 are exposed, and a structure as shown in FIG. 3L is obtained. FIG. 3M shows the close view of portion 355 in FIG. 3L. FIG. 3M illustrates that the second, the fourth, the sixth and the eighth conductive layers 318, 326, 334, 342 are the highest; the first, the third, the fifth and the seventh conductive layers 314, 322, 330, 342 are lower; and the dielectric layers are the lowest.

Figure 3O:
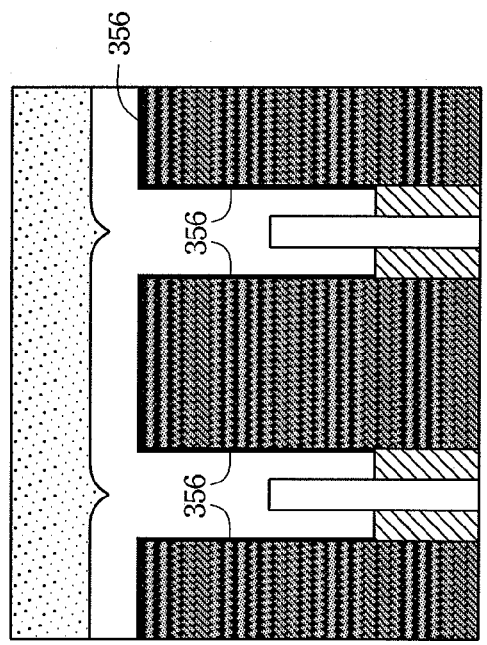
FIG. 3O is a close view of portion 355 in FIG. 3N.
Figure 3N:
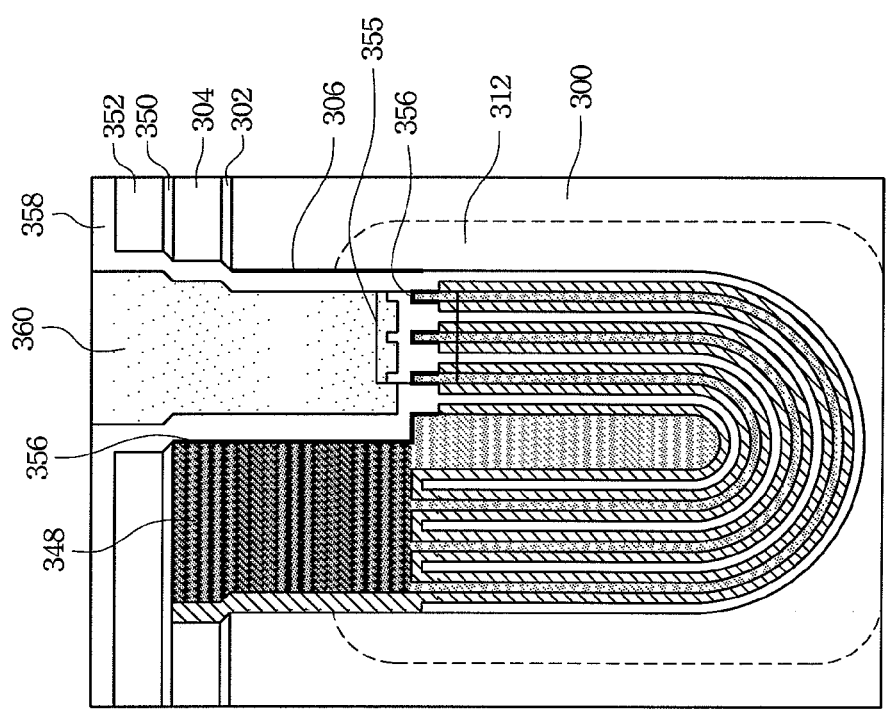
FIG. 3N is a schematic, cross-sectional view of the substrate, illustrating the structure of the unfinished multilayer electrode capacitor.

In FIG. 3N, after performing a nitridation step, insulating silicon nitride surface 356 is formed on the second, the fourth, the sixth and the eighth conductive layers 318, 326, 334, 338 and on the first connecting layer 348. Conductive titanium nitride surfaces are formed on the first, the third, the fifth and the seventh conductive layers 314, 322, 330, 338. Then, a second connecting layer 358 (such as titanium nitride) is formed on the substrate 300 and the trench 306. The first, the third, the fifth and the seventh conductive layers 314, 322, 330, 338 are connected with the doped area 312 to form the other electrode in the capacitor. After depositing a second insulating layer to fill the trench 306 and performing a CMP process, the structure shown in FIG. 3N is obtained. FIG. 3O shows the close view of portion 355 in FIG. 3N.

Figure 3Q:
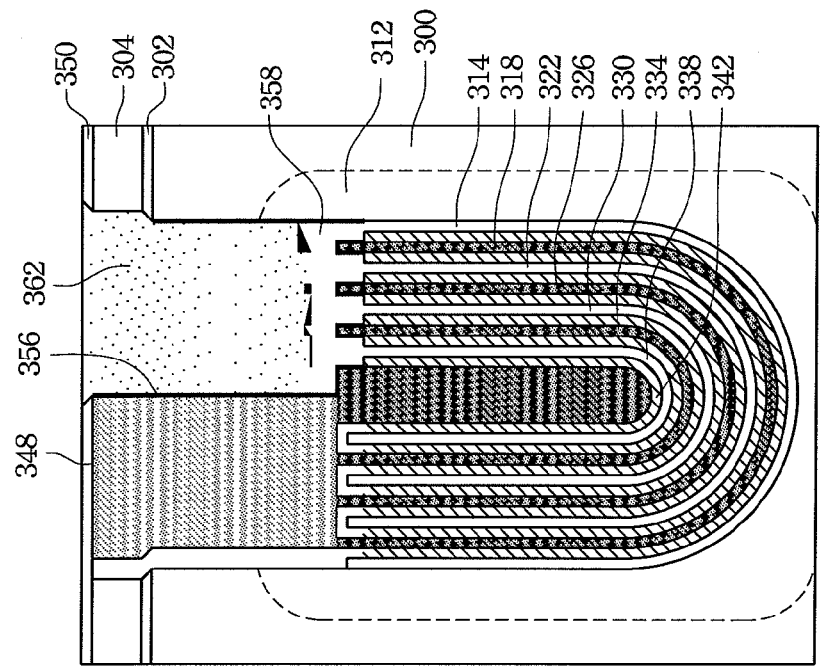
FIG. 3Q is a schematic, cross-sectional view of the substrate, illustrating the structure of the multilayer electrode capacitor of an embodiment according to the present invention.
Figure 3P:
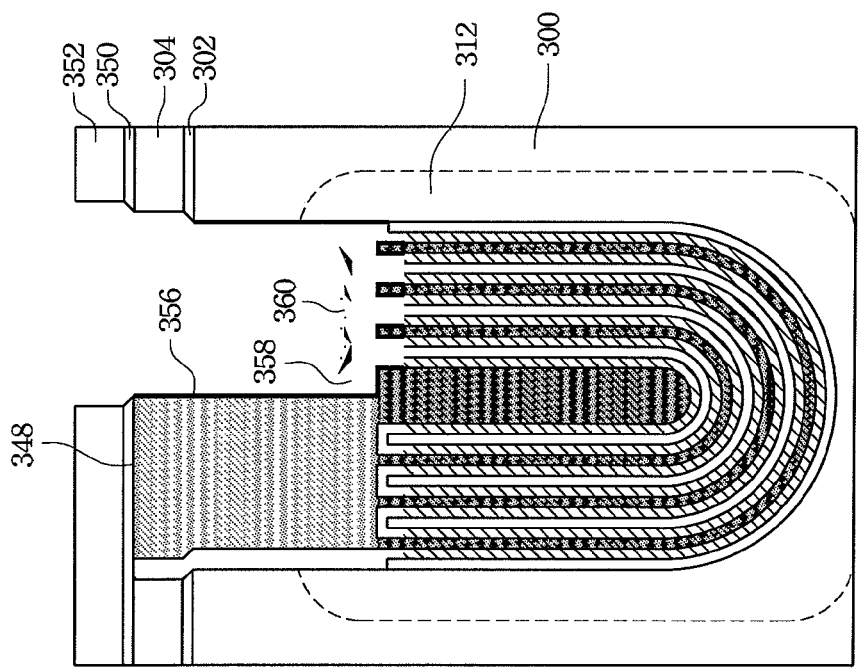
FIG. 3P is a schematic, cross-sectional view of the substrate, illustrating the structure of the unfinished multilayer electrode capacitor.

Referring to FIG. 3P, a portion of the second connecting layer and a portion of the second insulating layer are removed by a conventional dry or wet etching process. In FIG. 3P, the remaining second connecting layer is only electrically connected with the first, the third, the fifth and the seventh conductive layers 314, 322, 330, 338, and electrically insulated from the first connecting layer 348.

A third insulating layer is deposited on the substrate until the trench 306 is filled. Then the multilayer-electrode capacitor is obtained after performing a CMP process to remove the nitride layer 352 and a portion of the third insulating layer 362. FIG. 3Q illustrates the structure of the multilayer-electrode capacitor according to the first preferred embodiment of the present invention. The first connecting layer 348 may connect with the drain source of a transistor via a conductive line. In the multilayer-electrode capacitor, the one set of the electrodes of this invention could increase the capacitance value without increasing the occupied volume thereof.

The Second Preferred Embodiment

In the second preferred embodiment, a stacked multilayer electrode is produced in an insulating layer on a semiconductor device by the method described in the first embodiment according to the present invention.

Figure 4A:
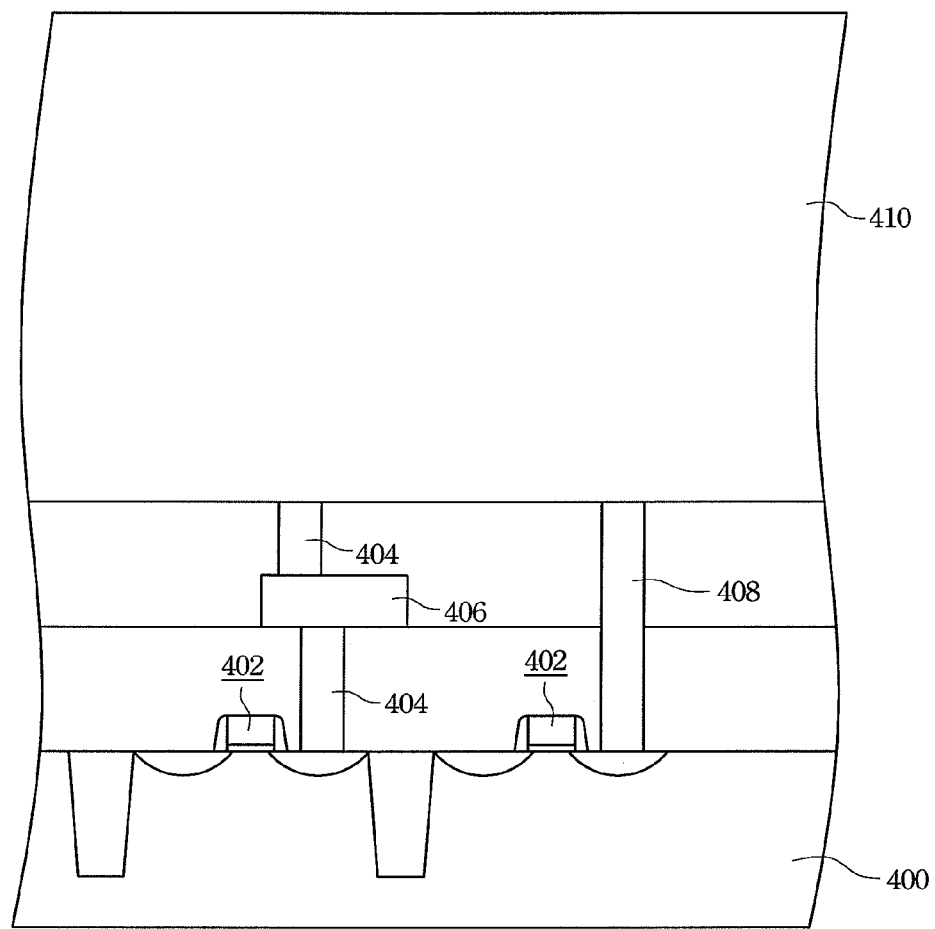
FIG. 4A is a schematic, cross-sectional view of a semiconductor product with several transistors and interconnecting lines.

FIG. 4A is a schematic, cross-sectional view of a semiconductor product with several transistors 402 and interconnecting lines 406 on the substrate 400. Before producing a stacked multilayer electrode capacitor according to the present invention, contact 408 is produced for electrically connecting with one of the electrodes of the multilayer electrode capacitor during the process for producing the transistors 402, the interconnecting lines 406 and via plugs 404.

Figure 4B:
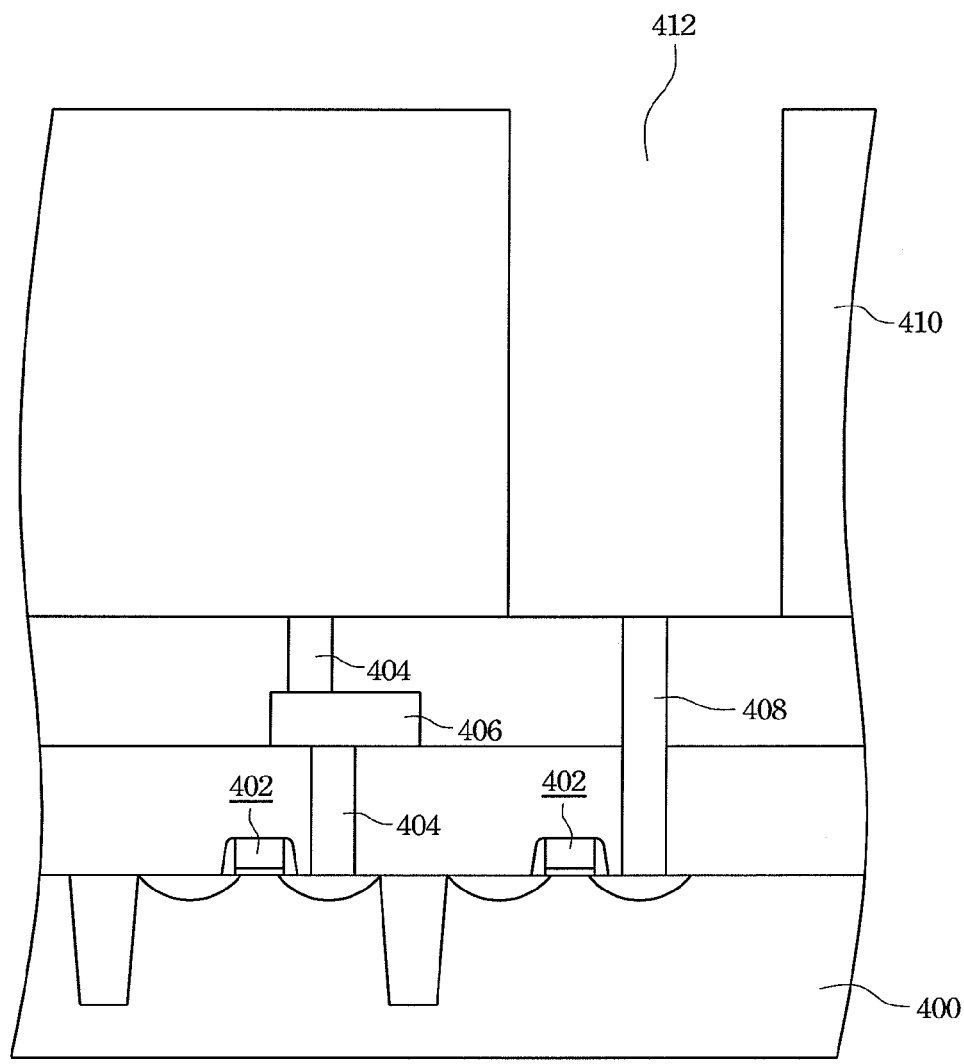
FIG. 4B is a schematic, cross-sectional view of the semiconductor product, illustrating a trench formed in the dielectric layer on the substrate.

Referring to FIG. 4B, a trench 412 is formed in the insulating layer 410 by photolithography and etching and the top of the contact 408 is exposed by photolithography. The contact 408 is used for connecting with parts of electrodes of the multilayer-electrode capacitor as the doped area 312 in the first preferred embodiment.

After finishing trench 412, as in the method described in the first embodiment, a first conductive layer, a first dielectric layer, a second conductive layer, a second dielectric layer, a third conductive layer, a third dielectric layer, a fourth conductive layer, a fourth dielectric layer, a fifth conductive layer, a fifth dielectric layer, a sixth conductive layer, a sixth dielectric layer, a seventh conductive layer and a seventh dielectric layer are deposited on the inner surface of the trench in sequence. Finally, an eighth conductive layer is deposited in the trench until the trench is filled. The first, the third, the fifth and the seventh conductive layers are titanium. The second, the fourth, the sixth and the eighth conductive layers are aluminum. The dielectric layers are any material with high dielectric constant, such as silicon nitride.

Figure 4C:
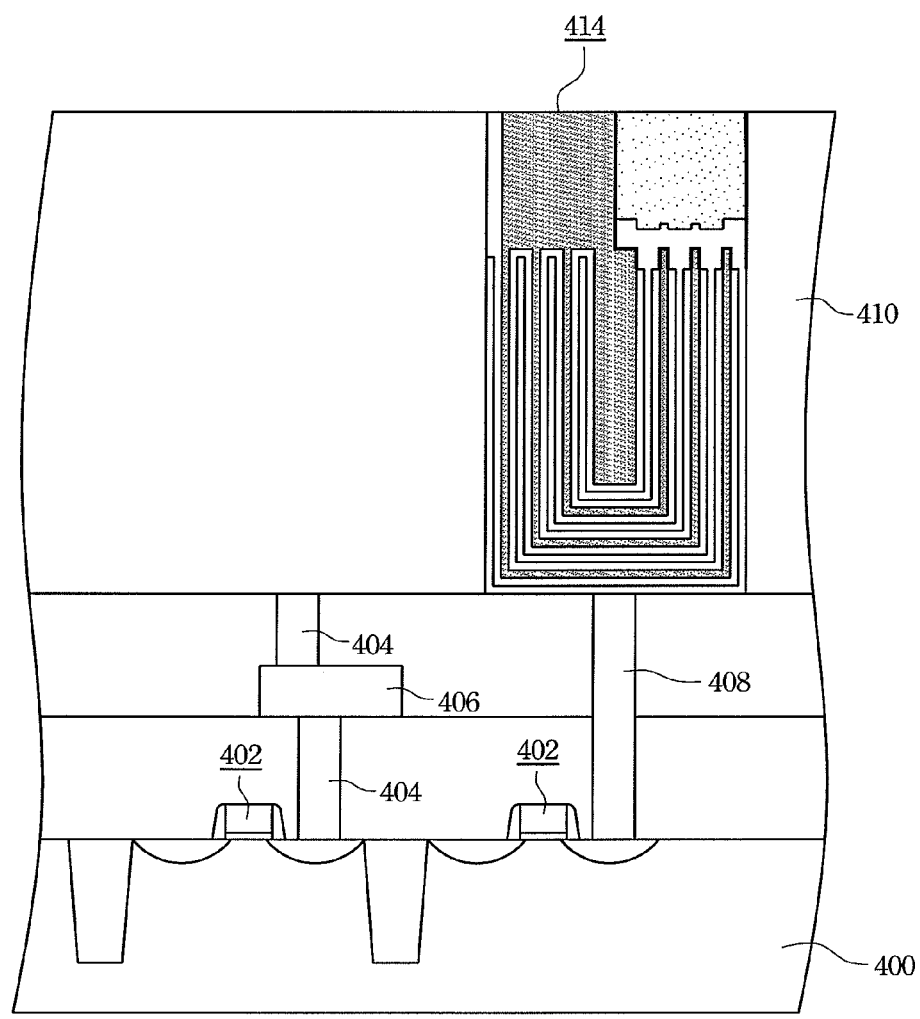
FIG. 4C is a schematic, cross-sectional view of the semiconductor product, illustrating a stacked multilayer electrode capacitor formed in the dielectric layer on the semiconductor product according to the present invention.

After finishing all the conductive layers and the dielectric layers in the trench, the same steps described in the first preferred embodiment are performed. A first connecting layer connects the first, the third, the fifth and the seventh conductive layers to form one of the electrodes, and a second connecting layer connects the second, the fourth, the sixth and the eighth conductive layers to form of the other electrode. The stacked multilayer electrode capacitor according to the present invention is thus achieved, and the structure of the stacked capacitor is shown in FIG. 4C.

The detailed description in the foregoing embodiments is used merely for the purpose of representation, and shall not be used to restrict the scope of the present invention. Therefore, the spirit and scope of the appended claims should no be limited to the description of the preferred embodiments contained herein.

It will be apparent to those skilled in the art that various modifications and variations can be made to the method of the present invention without departing from the scope or spirit of the invention. In view of the foregoing, it is intended that the present invention cover modifications and variations of this invention provided they fall within the scope of the following claims and their equivalents.

What is claimed is:

1. A method for forming a multilayer electrode capacitor, comprising:
    (a) forming a trench in a substrate;
    (b) at least forming a first conductive layer, a dielectric layer, and a second conductive layer on an inner surface of the trench in sequence;
    (c) removing a portion of the first conductive layer, a portion of the dielectric layer and a portion of the second conductive layer above the top of the trench, and wet etching the first conductive layer, the dielectric layer and the second conductive layer to generate a first distance between a top of the first conductive layer and a top of the trench, and a second distance between a top of the second conductive layer and the top of the trench, wherein the first distance is greater or smaller than the second distance;
    (d) forming a first insulating layer, wherein when the first distance is greater than the second distance, the first insulating layer covers the first conductive layer and exposes the second conductive layer, and when the second distance is greater than the first distance, the first insulating layer covers the second conductive layer and exposes the first conductive layer;
    (e) forming a first connecting layer to connect electrically with the exposed second conductive layer, or electrically connect with the exposed first conductive layer;
    (f) removing a portion of the first connecting layer and a portion of the first insulating layer to expose a portion of the first conductive layer and a portion of the second conductive layer;
    (g) performing a surface treatment to transform an exposed surface of the first conductive layer into first conductive surface and to transform an exposed surface of the second conductive layer into second insulating surface when the first connecting layer electrically connects with the second conductive layer, or to transform exposed surface of the first conductive layer into first insulating surface and to transform an exposed surface of the second conductive layer into second conductive surface when the first connecting layer electrically connects with the second conductive layer; and
    (h) forming a second connecting layer to connect electrically with the second conductive layer with the second conductive surface, or to connect with the first conductive layer with the first conductive surface, wherein the second connecting layer is insulated from the first connecting layer and the first conductive layer with the first insulating surface, or the second conductive layer with the second insulating surface.

2. The method of claim 1, wherein in step (a), the substrate comprises an insulating layer thereon, and the trench is formed in the insulating layer.

3. The method of claim 1, wherein after step (b), further comprises a step (b1) to form the dielectric layer and the first conductive layer in sequence.

4. The method of claim 3, wherein after step (b1), further comprises a step (b3) to form the dielectric layer, the second conductive layer, the dielectric layer and the first conductive layer in sequence.

5. The method of claim 1, wherein after step (b), further comprises a step (b2) to form the dielectric layer, the first conductive layer, the dielectric layer and the second conductive layer in sequence.

6. The method of claim 1, wherein the step (d) of forming the first insulating layer, further comprises forming the first insulating layer on the substrate, a sidewall of the trench, the first conductive layer, the second conductive layer and the dielectric layer, and etching the first insulating layer to expose the first conductive layer or the second conductive layer.

7. The method of claim 1, wherein the surface treatment is oxidation or nitridation.

8. The method of claim 1, wherein the conductive layer with the first conductive surface or the second conductive surface is Ti or TiN when the surface treatment is nitridation.

9. The method of claim 1, wherein the conductive layer with the first conductive surface or the second conductive surface is Ru, RuO2, indium tin oxide or indium zinc oxide when the surface treatment is oxidation.

10. The method of claim 1, wherein the conductive layer with the insulated surface is aluminum or polysilicon.

11. The method of claim 1, wherein the dielectric constant of the dielectric layer is equal to or larger than 3.9.

12. The method of claim 11, wherein the dielectric layer is silicon nitride, silicon oxide, aluminum oxide, zirconium oxide, titanium oxide, hafnium oxide, strontium oxide, BaTiO3, BaO or (Ba,Sr)TiO3.

13. A method for forming a multilayer electrode capacitor, comprising:

(a) forming a trench in a substrate;
(b) at least forming a first conductive layer, a dielectric layer, and a second conductive layer on an inner surface of the trench in sequence;
(c) removing a portion of the first conductive layer, a portion of the second conductive layer and a portion of the dielectric layer above the top of the trench;
(d) performing a surface treatment to convert an exposed surface of the first conductive layer to first conductive surface and to convert an exposed surface of the second conductive layer to second insulating surface, or performing the surface treatment to convert the an exposed surface of the first conductive layer to first insulating surface and to convert the exposed surface of the second conductive layer to second conductive surface;
(e) forming a first connecting layer to connect electrically the second conductive layer with the second conductive surface, or to connect the first conductive layer with the first conductive surface;
(f) removing portions of the first connecting layer and the first insulating surfaces on the first conductive layer or the second insulating surface on the second conductive layer;
(g) wet etching the exposed first conductive layer and the exposed second conductive layer to generate a first distance between a top of the first conductive layer and a top of the trench, and a second distance between a top of the second conductive layer and the top of the trench, wherein the first distance is greater than the second distance when the first connecting layer connects with the first conductive layer, and the second distance is greater than the first distance when the first connecting layer connects with the second conductive layer;
(h) forming a first insulating layer, wherein when the first distance is greater than the second distance, the first insulating layer covers the first conductive layer and exposes the second conductive layer, and when the second distance is greater than the first distance, the first insulating layer covers the second conductive layer and exposes the first conductive layer; and
(i) forming a second connecting layer to connect electrically with the exposed second conductive layer or the exposed first conductive layer, and to be electrically insulated from the first connecting layer.

14. The method of claim 13, wherein in step (a), the substrate comprises an insulating layer thereon, and a trench is formed in the insulating layer.

15. The method of claim 13, wherein after step (b), further comprises a step (b1) to form the dielectric layer and the first conductive layer in sequence.

16. The method of claim 15, wherein after step (b1), further comprises a step (b3) to form the dielectric layer, the second conductive layer, the dielectric layer and the first conductive layer in sequence.

17. The method of claim 13, wherein after step (b), further comprises a step (b2) to form the dielectric layer, the first conductive layer, the dielectric layer and the second conductive layer in sequence.

18. The method of claim 13, wherein step (h) of forming the first insulating layer comprises forming the first insulating layer on the substrate, a sidewall of the trench, the first conductive layer, the second conductive layer and the dielectric layer, and etching the first insulating layer to expose the first conductive layer or the second conductive layer.

19. The method of claim 13, wherein the surface treatment is oxidation or nitridation.

20. The method of claim 13, wherein the conductive layer with the first conductive surface or the second conductive surface is Ti or TiN when the surface treatment is nitridation.

21. The method of claim 13, wherein the conductive layer with the first conductive surface or the second conductive surface is Ru, RuO2, indium tin oxide or indium zinc oxide when the surface treatment is oxidation.

22. The method of claim 13, wherein the conductive layer with the insulated surface is aluminum or polysilicon.

23. The method of claim 13, wherein the dielectric constant of the dielectric layer is equal to or larger than about 3.9.

24. The method of claim 23, wherein the dielectric layer is silicon nitride, silicon oxide, aluminum oxide, zirconium oxide, titanium oxide, hafnium oxide, strontium oxide, BaTiO3, BaO or (Ba,Sr)TiO3.

* * * * *